US010522406B2

(12) United States Patent
Dang et al.

(10) Patent No.: US 10,522,406 B2
(45) Date of Patent: Dec. 31, 2019

(54) IR ASSISTED FAN-OUT WAFER LEVEL PACKAGING USING SILICON HANDLER

(71) Applicant: International Business Machines Corporation, Armonk, NY (US)

(72) Inventors: Bing Dang, Chappaqua, NY (US); Jeffrey D. Gelorme, Burlington, CT (US); John U. Knickerbocker, Monroe, NY (US)

(73) Assignee: International Busniess Machines Corporation, Armonk, NY (US)

( * ) Notice: Subject to any disclaimer, the term of this patent is extended or adjusted under 35 U.S.C. 154(b) by 0 days.

(21) Appl. No.: 15/903,973

(22) Filed: Feb. 23, 2018

(65) Prior Publication Data

US 2018/0182672 A1    Jun. 28, 2018

Related U.S. Application Data

(62) Division of application No. 15/085,099, filed on Mar. 30, 2016, now Pat. No. 9,935,009.

(51) Int. Cl.
*H01L 21/78* (2006.01)
*H01L 23/00* (2006.01)
(Continued)

(52) U.S. Cl.
CPC ........ *H01L 21/7813* (2013.01); *H01L 21/568* (2013.01); *H01L 23/293* (2013.01); *H01L 23/3107* (2013.01); *H01L 23/481* (2013.01); *H01L 24/03* (2013.01); *H01L 24/05* (2013.01); *H01L 24/13* (2013.01); *H01L 24/19* (2013.01); *H01L 24/94* (2013.01); *H01L 24/97* (2013.01); *H01L 21/561* (2013.01); *H01L 23/3128* (2013.01); *H01L 25/0655* (2013.01); *H01L 2224/0239* (2013.01); *H01L 2224/02331* (2013.01); *H01L 2224/02335* (2013.01); *H01L 2224/02379* (2013.01); *H01L 2224/03002* (2013.01); *H01L 2224/03416* (2013.01); *H01L 2224/03452* (2013.01); *H01L 2224/03515* (2013.01); *H01L 2224/03831* (2013.01);
(Continued)

(58) Field of Classification Search
CPC .................. H01L 21/7806; H01L 21/7813
See application file for complete search history.

(56) References Cited

U.S. PATENT DOCUMENTS 7,534,498 B2    5/2009    Noda et al.
2013/0087916 A1    4/2013    Lin
(Continued)

OTHER PUBLICATIONS

List of IBM Patents or Patent Applications Treated as Related dated Feb. 23, 2018, 2 pages.

*Primary Examiner* — Daniel Luke
(74) *Attorney, Agent, or Firm* — Scully, Scott, Murphy & Presser, P.C.; JoAnn Kealy Crockatt

(57) ABSTRACT

A support structure for use in fan-out wafer level packaging is provided that includes, a silicon handler wafer having a first surface and a second surface opposite the first surface, a release layer is located above the first surface of the silicon handler wafer, and a layer selected from the group consisting of an adhesive layer and a redistribution layer is located on a surface of the release layer. After building-up a fan-out wafer level package on the support structure, infrared radiation is employed to remove (via laser ablation) the release layer, and thus remove the silicon handler wafer from the fan-out wafer level package.

12 Claims, 8 Drawing Sheets

(51) Int. Cl.
*H01L 23/31* (2006.01)
*H01L 23/29* (2006.01)
*H01L 23/48* (2006.01)
*H01L 21/56* (2006.01)
*H01L 25/065* (2006.01)

(52) U.S. Cl.
CPC ............ *H01L 2224/04105* (2013.01); *H01L 2224/05008* (2013.01); *H01L 2224/05147* (2013.01); *H01L 2224/12105* (2013.01); *H01L 2224/1301* (2013.01); *H01L 2224/13024* (2013.01); *H01L 2224/13025* (2013.01); *H01L 2224/13109* (2013.01); *H01L 2224/13111* (2013.01); *H01L 2224/13113* (2013.01); *H01L 2224/13116* (2013.01); *H01L 2224/13118* (2013.01); *H01L 2224/13139* (2013.01); *H01L 2224/13144* (2013.01); *H01L 2224/13147* (2013.01); *H01L 2224/16235* (2013.01); *H01L 2224/24137* (2013.01); *H01L 2224/73267* (2013.01); *H01L 2224/81005* (2013.01); *H01L 2224/94* (2013.01); *H01L 2924/15192* (2013.01); *H01L 2924/15311* (2013.01)

(56) References Cited

U.S. PATENT DOCUMENTS

| | | |
|---|---|---|
| 2014/0144593 A1 | 5/2014 | Dang et al. |
| 2015/0035554 A1 | 2/2015 | Dang et al. |
| 2016/0363349 A1 | 12/2016 | Fleury |

IR ASSISTED FAN-OUT WAFER LEVEL PACKAGING USING SILICON HANDLER

BACKGROUND

The present application relates to semiconductor wafer level packaging technology and, more particularly, to fan-out wafer level packaging processes in which infrared radiation is employed to release a silicon (Si) handler wafer from a fan-out wafer level package.

Smartphone, tablet and laptop computer consumers are depending on their electronic products to be small, light, and fast. Wafer Level Packaging (WLP) allows these products to be handheld sizes with high-quality graphics, instead of large bulky devices. Demand for WLP is not only driven by the need to shrink package size and height, but also for performance reasons. There are two general categories of WLP technologies: 'fan-in' and 'fan-out' wafer level packages (WLPs).

Conventional fan-in WLPs are formed on the dies while they are still on the uncut wafer. The final packaged device is the same size as the die itself. Singulation of the device occurs after the device is fully packaged. Thus, fan-in WLPs are a unique form of packages and have the distinction of being truly die-sized. WLPs with fan-in designs are typically employed for low input/output (I/O) count and smaller die sizes.

Fan-out WLP (or FOWLP) typically starts with the reconstitution or reconfiguration of individual dies to an artificial molded wafer. The molded reconstituted wafer forms a new base to apply a batch process that features build-up and metallization constructions, as in the conventional fan-in WLP back-end processes, to form the final packages.

FOWLP technology was developed to provide a solution for semiconductor devices requiring higher integration levels and a greater number of external contacts. FOWLP provides a smaller package footprint with higher input/output along with improved thermal and electrical performance.

In FOWLP technology, the semiconductor dies are typically formed above a glass handler wafer. Glass handler wafers have their limitations in terms of mechanical properties, thermal conductivity as well as semiconductor equipment compatibility. Also, silicon wafers are more desirable as a handler because they have higher mechanical strength than glass handler wafers and perform better in wafer warpage control. However, current silicon handler solutions require mechanical peeling for release, which can introduce high stress on FOWLP. As such, low-stress release of a silicon handler substrate from a FOWLP is needed. Also, needed is method in which the handler substrate can be released from a FOWLP by high-throughput.

SUMMARY

A support structure for use in fan-out wafer level packaging is provided that includes, a silicon handler wafer having a first surface and a second surface opposite the first surface, a release layer is located above the first surface of the silicon handler wafer, and a layer selected from the group consisting of an adhesive layer and a redistribution layer is located on a surface of the release layer. After building-up a fan-out wafer level package on the support structure, infrared radiation is employed to remove (via laser ablation) the release layer, and thus remove the silicon handler wafer from the fan-out wafer level package.

In one aspect of the present application, methods of forming fan-out wafer level packages are provided in which infrared radiation is employed to release a silicon (Si) handler wafer from a fan-out wafer level package. In one embodiment of the present application, the method may include providing a support structure comprising a silicon handler wafer having a first surface and a second surface opposite the first surface, a release layer located above the first surface of the silicon handler wafer, and an adhesive layer located on a surface of the release layer. Next, a fan-out wafer level package is formed on a surface of the adhesive layer. The silicon handler wafer is thereafter removed by laser ablating the release layer with infrared radiation, wherein the infrared radiation first enters the silicon handler wafer from the second surface.

In another embodiment of the present application, the method may include providing a support structure comprising a silicon handler wafer having a first surface and a second surface opposite the first surface, a release layer located above the first surface of the silicon handler wafer, and a redistribution layer located on a surface of the release layer. Next, a fan-out wafer level package is formed upon and within the redistribution layer. The silicon handler wafer is thereafter removed by laser ablating the release layer with infrared radiation, wherein the infrared radiation first enters the silicon handler wafer from the second surface.

In another aspect of the present application, a support structure for use in fan-out wafer level packaging is provided that includes, a silicon handler wafer having a first surface and a second surface opposite the first surface. A release layer is located above the first surface of the silicon handler wafer. A layer selected from the group consisting of an adhesive layer and a redistribution layer is located on a surface of the release layer.

DETAILED DESCRIPTION

Figure 1A:
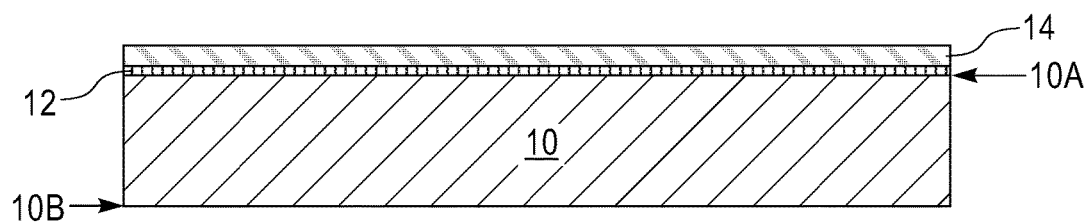
FIG. 1A is a cross sectional view of an exemplary support structure including, from bottom to top, a silicon handler wafer, a release layer and an adhesive layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As mentioned above, a support structure for use in fan-out wafer level packaging is provided that includes, a silicon handler wafer having a first surface and a second surface opposite the first surface, a release layer is located above the first surface of the silicon handler wafer, and a layer selected from the group consisting of an adhesive layer and a redistribution layer is located on a surface of the release layer. After building-up a fan-out wafer level package on the support structure, infrared radiation is employed to remove (via laser ablation) the release layer, and thus remove the silicon handler wafer from the fan-out wafer level package. After releasing the silicon handler wafer from the fan-out level package, the silicon handler wafer can be reused.

The use of silicon handler wafers in the present application over conventional glass handler wafers improves the compatibility of the support structure with the semiconductor materials and equipment used to form the fan-out wafer level package. Also, and unlike glass handler wafers, silicon handler wafers are compatible with existing wafer notch inspection tools. Further, the use of silicon handler wafers in fan-out wafer level package can reduce and, in some instances, even eliminate stress on the fan-out wafer level package such that little or no warping of the fan-out wafer level package occurs.

Referring first to FIG. 1A, there is illustrated an exemplary support structure including, from bottom to top, a silicon handler wafer 10, a release layer 12 and an adhesive layer 14 that can be employed in accordance with an embodiment of the present application.

The silicon handler wafer 10 has a first surface 10A and a second surface 10B that opposing the first surface 10A. In the drawings of the present application, the first surface 10A of the silicon handler wafer 10 represents the side of the silicon handler wafer 10 in which the release layer 12 and adhesive layer 14 are formed. The second surface 10B of the silicon handler wafer 10 is the side of the silicon handler wafer 10 opposite that containing the release layer 12 and the adhesive layer 14.

In one embodiment of the present application, the silicon handler wafer 10 may comprise a single crystalline silicon material. In another embodiment of the present application, the silicon handler wafer 10 may comprise a polycrystalline silicon material. In yet another embodiment of the present application, the silicon handler wafer 10 may comprise an amorphous silicon material.

The silicon handler wafer 10 may have any of the well known crystallographic orientations. For example, the crystallographic orientation of the silicon handler wafer 10 may be {100}, {110} or {111}. The silicon handler wafer 10 may have other crystallographic orientations besides those specifically mentioned in the present application.

The silicon handler wafer 10 may be an intrinsic silicon material. By "intrinsic" it is meant that the silicon material that provides the silicon handler wafer 10 contains no impurities atoms such as, for example, p-type dopants or n-type dopants. In another embodiment of the present application, the silicon handler wafer 10 may be an n-type or p-type doped silicon material. The term "n-type" refers to the addition of impurities to an intrinsic semiconductor material that contributes free electrons to the semiconductor material. In silicon, examples of n-type dopants, i.e., impurities, include, but are not limited to, antimony, arsenic and phosphorus. The term "p-type" refers to the addition of impurities to an intrinsic semiconductor material that creates deficiencies of valence electrons. In silicon, examples, of p-type dopants, i.e., impurities, include, but are not limited to, boron, aluminum, gallium and indium.

The silicon handler wafer 10 of the present application may contain a wafer notch (not shown) which can be used with current semiconductor wafer notch inspection tools. The silicon handler wafer 10 that is employed in the present application is transparent to IR radiation as defined herein.

In some embodiments of the present application, and as shown in FIG. 1A, the release layer 12 is formed directly on the first surface 10A of the silicon handler wafer 10. The release layer 12 may include any material that can be removed by laser ablating with infrared radiation. In one embodiment of the present application, the release layer 12 may be a metallic film such as, for example, aluminum, tin or zinc. In such an embodiment, the metallic film that provides the release layer 12 can be formed utilizing a deposition process such as, for example, chemical vapor deposition (CVD), physical vapor deposition (PVD) or atomic layer deposition (ALD). The metallic film that can provide the release layer 12 is a continuous layer that covers an entirety of the first surface 10A of the silicon handler substrate 10. The metallic film that can be used to provide the release layer 12 may have a thickness from 1 nm to 20 nm. Other thicknesses that are lesser than, or greater than, the aforementioned thickness range may also be employed in the present application.

In another embodiment of the present application, the release layer 12 may be a layer of carbon material such as, for example, a graphene layer or a layer of carbon nanotubes. In such embodiments, the carbon material may be disposed on the first surface 10A of the silicon handler substrate 10 utilizing techniques well known to those skilled in the art. The layer of carbon material that can be used to provide the release layer 12 may have a thickness from 5 nm to 200 nm. Other thicknesses that are lesser than, or greater than, the aforementioned thickness range may also be employed in the present application.

Next, the adhesive layer 14 is formed on an exposed surface of the release layer 12. The adhesive layer 14 is composed of a dielectric material that can be formed utilizing any deposition technique such as, for example, CVD, PVD or ALD. In one embodiment of the present application, the adhesive layer 14 is composed of silicon dioxide. In another embodiment of the present application, the adhesive layer 14 may include a dielectric metal oxide or dielectric metal oxynitride. Examples of metals that can be present in the dielectric material oxide or dielectric metal oxynitride may include aluminum, hafnium, zirconium, lanthanum, titanium, strontium, yttrium as well as alloys or combinations of the metals. The adhesive layer 14 of the present application may have a thickness of from 5 μm to 50 μm. Other thicknesses that are lesser than, or greater than, the aforementioned thicknesses for the adhesive layer 14 can also be employed in the present application.

Figure 1B:
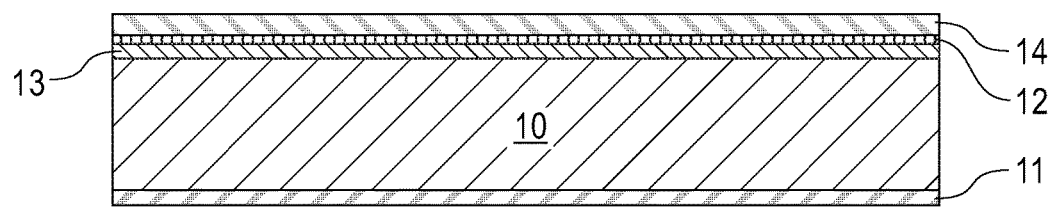
FIG. 1B is a cross sectional view of another exemplary support structure including, from bottom to top, a bottom antireflective coating layer, a silicon handler wafer, a top antireflective coating layer, a release layer and an adhesive layer that can be employed in accordance with an embodiment of the present application.

Reference is now made to FIG. 1B, which illustrates another exemplary support structure that may be used in the present application. In the illustrated embodiment, the support structure includes, from bottom to top, a bottom antireflective coating layer 11, a silicon handler wafer 10, a top antireflective coating layer 13, a release layer 12 and an adhesive layer 14. In some embodiments, the bottom antireflective coating layer 11 may be omitted from the support structure. In another embodiment of the present application, the top antireflective coating 13 may be omitted from the support structure.

The bottom antireflective coating layer 11 is formed on the second surface 10B of the silicon handler substrate 10, while the top antireflective coating layer 13 is formed on the first surface 10A of the silicon handler substrate 10. In some embodiments, the bottom antireflective coating layer 11 and the top antireflective coating 13 may be composed of a same antireflective coating material. In another embodiment, the bottom antireflective coating layer 11 may be composed of a different antireflective coating material than the top antireflective coating 13. In either embodiment, the antireflective coating material that provides the bottom antireflective coating layer 11 and the top antireflective coating 13 includes a material that reduces image distortions associated with reflections off the surface of an underlying material or material stack. In embodiment of the present application, the antireflective coating material that provides the bottom antireflective coating layer 11 and/or the top antireflective coating 13 may be composed of a Si-containing material. In one example, the antireflective coating material that provides the bottom antireflective coating layer 11 and/or the top antireflective coating 13 may be composed of silicon nitride.

The antireflective coating material that provides the bottom antireflective coating layer 11 and/or the top antireflective coating 13 may be formed utilizing a conventional deposition process such, as for example, CVD or spin-coating. The antireflective coating material that provides the bottom antireflective coating layer 11 and/or the top antireflective coating 13 may have a thickness from 20 nm to 500 nm, although other thicknesses that are lesser than, or greater than, the aforementioned thickness range may also be employed as the thickness of the antireflective coating material that provides the bottom antireflective coating layer 11 and/or the top antireflective coating 13.

Figure 2:
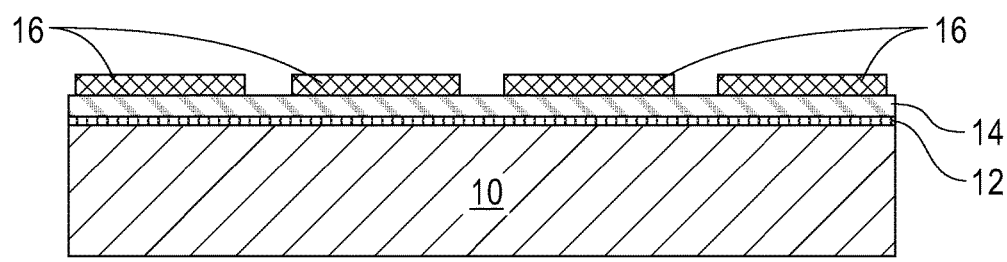
FIG. 2 is a cross sectional view of the exemplary support structure of FIG. 1A after disposing a plurality of semiconductor dies atop the adhesive layer.

Referring now to FIG. 2, there is illustrated the exemplary support structure of FIG. 1A after disposing a plurality of semiconductor dies 16 atop the adhesive layer 14. Although the exemplary support structure shown in FIG. 1A is specifically shown and described, the exemplary support structure of FIG. 1B may be used instead of the one illustrated in FIG. 1A. Each semiconductor die 16 includes a block of a semiconductor material having semiconductor properties such as, for example, silicon, germanium, silicon germanium alloys or III-V compound semiconductors on which a given functional circuit is formed. Each semiconductor die 16 may include a semiconductor chip containing at least one semiconductor device, and an interconnect structure containing metal lines and/or vias embedded in an interlevel dielectric material. Each semiconductor die 16 may be formed utilizing conventional processing techniques that are well known to those skilled in the art including, for example, semiconductor device fabrication, interconnect fabrication, wafer mounting and semiconductor-die cutting. Each semiconductor die 16 may be disposed on the adhesive layer 14 utilizing a chip-placing tool as is known to those skilled in the art.

Figure 3:
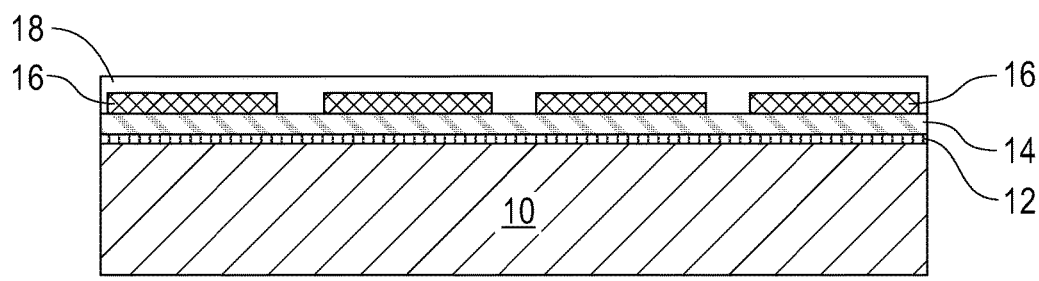
FIG. 3 is a cross sectional view of the exemplary support structure of FIG. 2 after forming a first redistribution layer surrounding sidewall surfaces and a topmost surface of each semiconductor die of the plurality of semiconductor dies.

Referring now to FIG. 3, there is illustrated the exemplary support structure of FIG. 2 after forming a first redistribution layer 18 surrounding sidewall surfaces and a topmost surface of each semiconductor die 16 of the plurality of semiconductor dies. The first redistribution layer 18 may include any photoimageable dielectric material. By "photoimageable dielectric material" it is meant any dielectric material that can be directly patterned by exposure to light and development without the need of utilizing a separate photoresist material. Examples of photoimageable dielectric materials that may be used in providing the first redistribution layer 18 include, but are not limited to, polyimdes and benzocylobutene (BCB). In some embodiments of the present application, the photoimageable dielectric material that provides the first redistribution layer 18 can be formed by utilizing a deposition process such as, for example, CVD or spin-on coating. A thermal baking step may follow the deposition of the photoimageable dielectric material.

The first redistribution layer 18 of the present application may have a thickness of from 200 nm to 5000 nm. Other thicknesses that are lesser than, or greater than, the aforementioned thicknesses for the first redistribution layer 18 can also be employed in the present application so long as the first redistribution layer 18 is present over the topmost surface of each semiconductor die 16.

Figure 4:
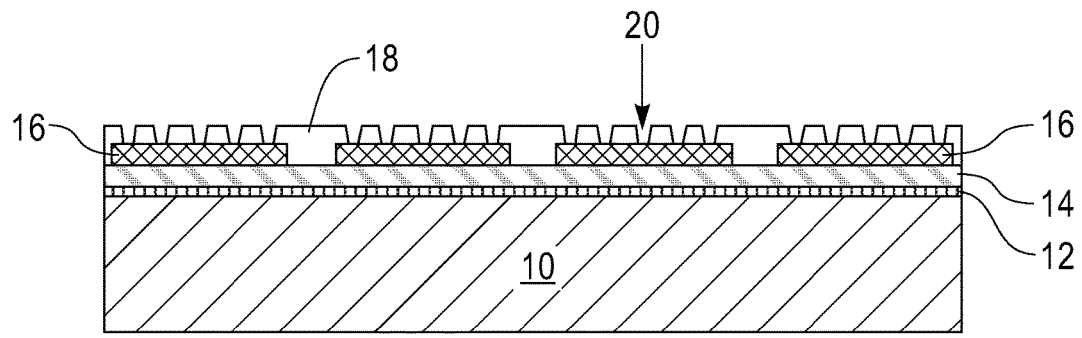
FIG. 4 is a cross sectional view of the exemplary support structure of FIG. 3 after patterning the first redistribution layer to include a plurality of first openings that expose a portion of the topmost surface of each semiconductor die of the plurality of semiconductor dies.

Referring now to FIG. 4, there is illustrated the exemplary support structure of FIG. 3 after patterning the first redistribution layer 18 to include a plurality of first openings 20 that expose a portion of the topmost surface of each semiconductor die 16 of the plurality of semiconductor dies. The patterning of the first redistribution layer 18 may be performed by exposing the first redistribution layer 18 to a pattern of irradiation and developing the exposed first redistribution layer 18 utilizing a conventional developer. In some embodiments, an etch such as a plasma etch may follow exposure of the photoimageable dielectric material.

The first opening 20 may be via openings, line openings, or any combination thereof. Typically, the first openings 20 are via openings that are formed entirely through the first redistribution layer 18.

Figure 5:
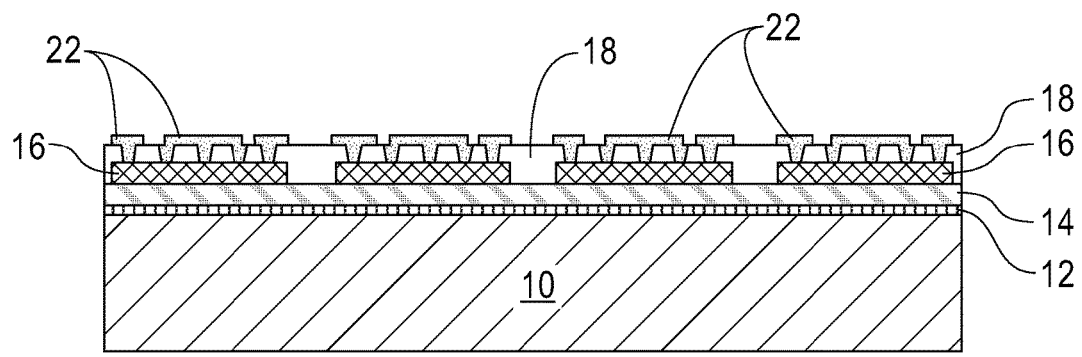
FIG. 5 is a cross sectional view of the exemplary support structure of FIG. 4 after performing a metallization process.

Referring now to FIG. 5, there is illustrated the exemplary support structure of FIG. 4 after performing a metallization process. The metallization process forms metallization structures 22 that include a lower portion located in each first opening 20 and an upper portion located on a topmost surface of the patterned first redistribution layer 18. The lower portion of the metallization structure 22 may be referred to as a metallic contact structure and it can be composed of any contact metal such as, for example, copper, tungsten, aluminum or alloys thereof. The upper portion of the metallization structure 22 may be referred to herein as a metallic pad which can be composed of a metallic material such as, for example, copper. In one embodiment, the upper and lower portions of the metallization structure 22 may be composed of a same metallic material. In another embodiment, the upper portion of the metallization structure 22 may be composed of a different metallic material than the lower portion of the metallization structure 22.

The metallization process may include deposition of a metallic material and patterning the metallic material. The patterning of the metallic material may include lithography and etching. In some embodiments, a planarization process can be used between the deposition and patterning steps. In the illustrated embodiment, each metallization structure 22 forms circuitry for an individual semiconductor die 16.

Figure 6:
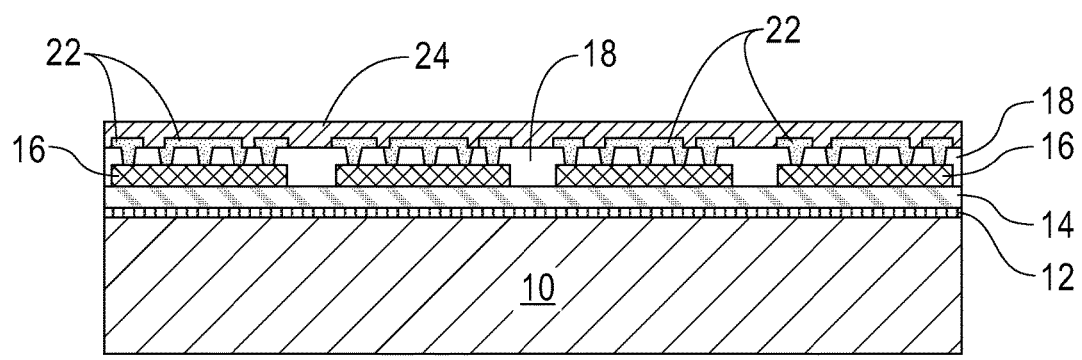
FIG. 6 is a cross sectional view of the exemplary support structure of FIG. 5 after forming a second redistribution layer atop the first redistribution layer and atop the metallization structures provided by the metallization process.

Referring now to FIG. 6, there is illustrated the exemplary support structure of FIG. 5 after forming a second redistribution layer 24 atop the first redistribution layer 18 and atop the metallization structures 22 provided by the metallization process. The second redistribution layer 24 may include one of the photoimageable dielectric materials mentioned above for the first redistribution layer 18. In one embodiment of the present application, the second redistribution layer 24 is composed of a same photoimageable dielectric material as the first redistribution layer 18. In another embodiment of the present application, the second redistribution layer 24 is composed of a different photoimageable dielectric material than the first redistribution layer 18.

The second redistribution layer 24 may be formed utilizing the same technique as mentioned above in providing the first redistribution layer 18. The second redistribution layer 24 may have a thickness within the range mentioned above for the first redistribution layer 18.

Figure 7:
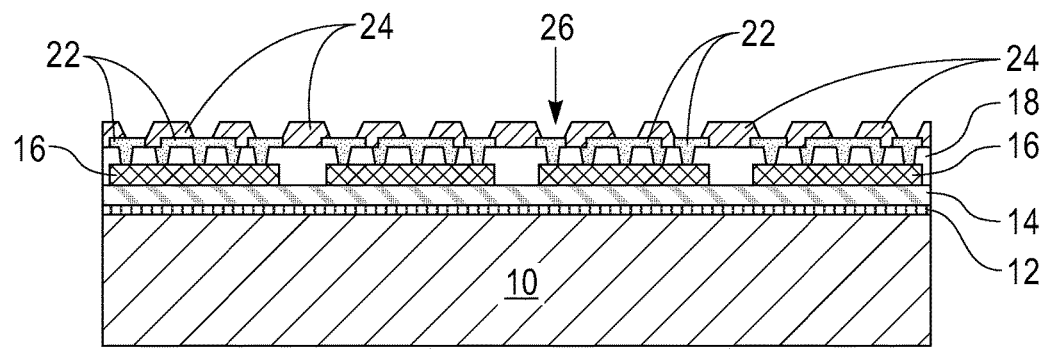
FIG. 7 is a cross sectional view of the exemplary support structure of FIG. 6 after forming a plurality of second openings in the second redistribution layer.

Referring now to FIG. 7, there is illustrated the exemplary support structure of FIG. 6 after forming a plurality of second openings 26 in the second redistribution layer 24. Each second opening 26 exposes a topmost surface of an upper portion (i.e., metallic pad) of the metallization structure 22. Each second opening 26 can be formed utilizing the same technique used to provide each first opening 20. That is, each second opening 26 may be formed by exposing the second redistribution layer 26 to a pattern of irradiation and developing the exposed second redistribution layer 26 utilizing a conventional developer or by etching.

Figure 8:
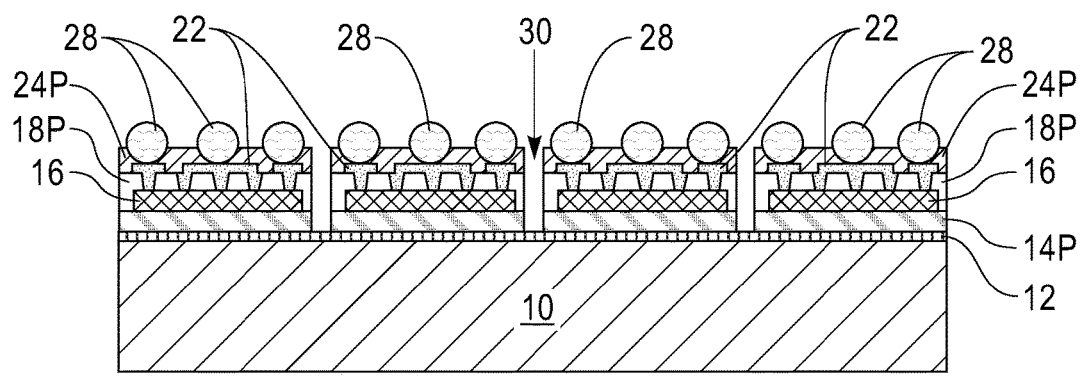
FIG. 8 is a cross sectional view of the exemplary support structure of FIG. 7 after forming a plurality of solder balls in each second opening.

Referring now to FIG. 8, there is illustrated the exemplary support structure of FIG. 7 after forming a plurality of solder balls 28 in each second opening 26 and forming a groove 30 between each semiconductor die 16. Each solder ball 28 contacts an exposed topmost surface of an upper portion (i.e., metallic pad) of the metallization structure 22. Each groove 30 extends from the topmost surface of second redistribution layer 24 down to the topmost surface of the release layer 12. In FIG. 8, element 24P denotes a remaining portion of the second redistribution layer 26 (hereinafter second redistribution layer portion 24P), element 18P denotes a remaining portion of the first redistribution layer 18 (hereinafter first redistribution layer portion 18P) and element 14P denotes a remaining portion of the adhesive layer 14 (hereinafter adhesive layer portion 14P).

Each solder ball 28 is formed employing methods known in the art. In one embodiment, the shape of the solder balls 28 can be spherical, cylindrical, or polygonal. The solder balls 28 can include for example, at least two elements selected from tin, silver, gold, lead, zinc, bismuth, indium, and copper.

Each groove 30 can be formed utilizing a dicing process. The dicing process used to provide each groove 30 may include dicing with a laser, dicing with a saw, or dicing utilizing a combination of laser dicing and saw dicing.

Figure 9:
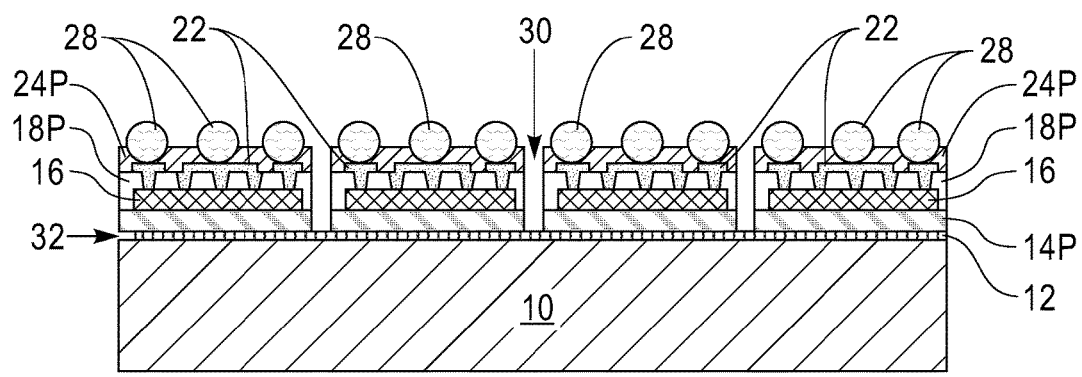
FIG. 9 is a cross sectional view of the exemplary support structure of FIG. 8 during an initial stage of infrared radiation (IR) exposure.

Referring now to FIG. 9, there is illustrated the exemplary support structure of FIG. 8 during an initial stage of infrared radiation (IR) exposure. In accordance with the present application, infrared radiation (IR) exposure causes laser ablation (i.e., vaporization) of release layer 12 and forms a void 32 between each adhesive layer portion 14P and the silicon handler substrate 10. In the present application, the void 32 can be formed anywhere in the release layer 12, and not just at one edge as shown in the drawings. In the present application, the infrared radiation first enters the silicon handler wafer 10 from the second surface 10B and then passes entirely through the silicon handler substrate 10 and through the first surface 10A wherein it removes, i.e., debonds, the silicon handler substrate 10 from the rest of the structure, i.e., fan-out level package. The removal of the silicon handler substrate 10 from the structure is shown in FIG. 10 of the present application.

In one embodiment of the present application, the infrared radiation (IR) exposure may be performed utilizing a laser that emits IR having a wavelength from 0.75 μm to 1.2 μm (i.e., near-IR and short-wavelength IR). In another embodiment, the infrared radiation (IR) exposure may be performed utilizing a laser that emits IR having a mid-wavelength of from 1.2 μm to 3 μm. In yet another embodiment, the infrared radiation (IR) exposure may be performed utilizing a laser that emits IR having a wavelength from 3 μm to 12 μm (i.e., long wavelength IR). Generally, the infrared radiation that can be employed in the present application has a wavelength from 0.75 μm to 12 μm. Typically, the IR employed to ablate the release layer 12 from the structure is within the mid-IR range. In such a range, the silicon handler wafer 10 is at least 50% transparent to the infrared radiation.

The IR exposure is performed utilizing a laser that is raster-scanned across the entirety of the second surface 10B of the silicon handler substrate 10 until the entire release layer 12 is laser ablated such that the silicon handler substrate 10 is released from the remaining portion of the structure, i.e., the fan-out wafer level package.

Figure 10:
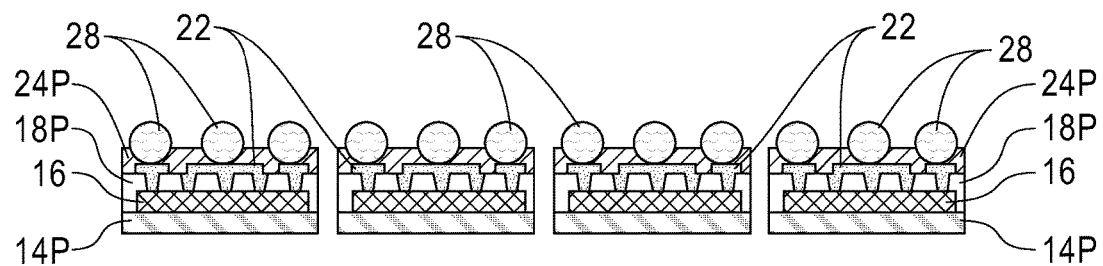
FIG. 10 is a cross sectional view of the exemplary support structure of FIG. 9 after completion of infrared radiation (IR) exposure.

In FIG. 10, individual fan-out wafer level packages are provided that include a single semiconductor die 16, solder balls 28, first and second redistribution layer portions (18P, 24P) metallization structures 22 embedded into the first and second redistribution layer portions (18P, 24P), and adhesive layer portion 14P.

Referring now to FIGS. 11-15, there are shown another embodiment of the present application, in which fan-out wafer level packages are provided that comprises a plurality of multiple semiconductor dies in electrical contact with each other. This embodiment of the present application begins by first providing the structure shown in FIG. 4 of the present application. Then, and with reference to FIG. 11, a metallization process is performed in which the metallization structures 22 provide electrical connection between a plurality of semiconductor dies 16L-16R. The metallization process used to provide the metallization structures 22 of this embodiment of the present application is the same as mentioned above in providing the structure shown in FIG. 5.

Figure 11:
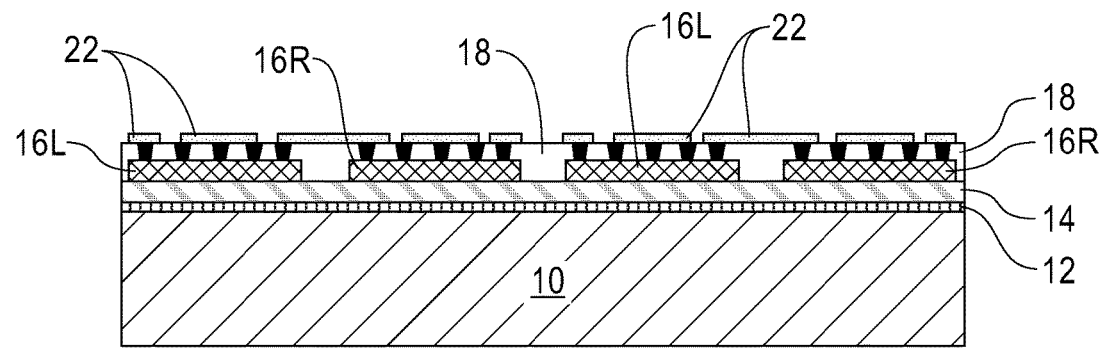
FIG. 11 is a cross sectional view of the exemplary support structure of FIG. 4 after performing a metallization process in accordance with another embodiment of the present application.
Figure 12:
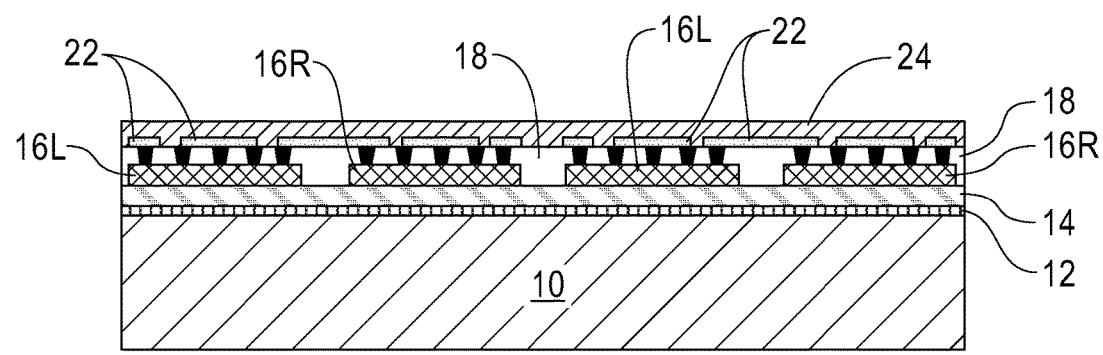
FIG. 12 is a cross sectional view of the exemplary support structure of FIG. 11 after forming a second redistribution layer atop the first redistribution layer and atop the metallization structures provided by the metallization process.

Referring now to FIG. 12, there is shown the exemplary support structure of FIG. 11 after forming a second redistribution layer 24 atop the first redistribution layer 18 and atop the metallization structures 22 provided by the metallization process. The second redistribution layer 24 of this embodiment is the same as that mentioned in the previous embodiment of the present application. Thus, the materials and methods for providing the second redistribution layer 24 of this embodiment of the present application are the same as described above in the previous embodiment of the present application.

Figure 13:
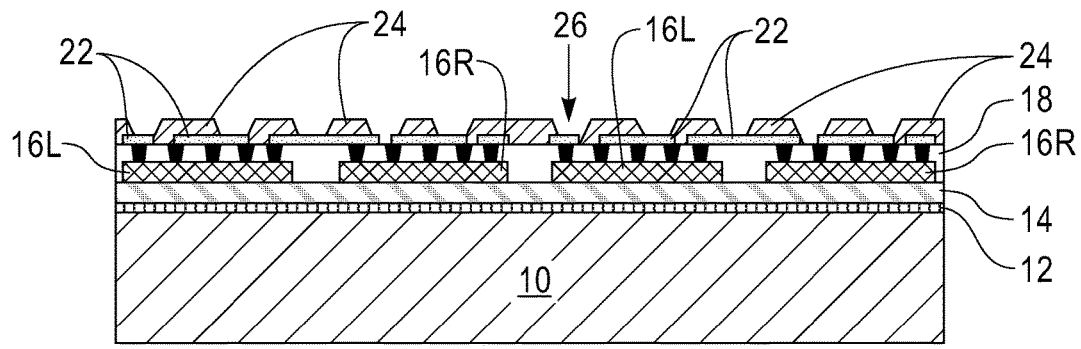
FIG. 13 is a cross sectional view of the exemplary support structure of FIG. 12 after forming a plurality of second openings in the second redistribution layer.

Referring now to FIG. 13, there is illustrated the exemplary support structure of FIG. 12 after forming a plurality of second openings 26 in the second redistribution layer 24. The plurality of second openings 26 of this embodiment of the present application can be formed utilizing the same technique in providing the plurality of second openings 26 in the previous embodiment of the present application.

Figure 14:
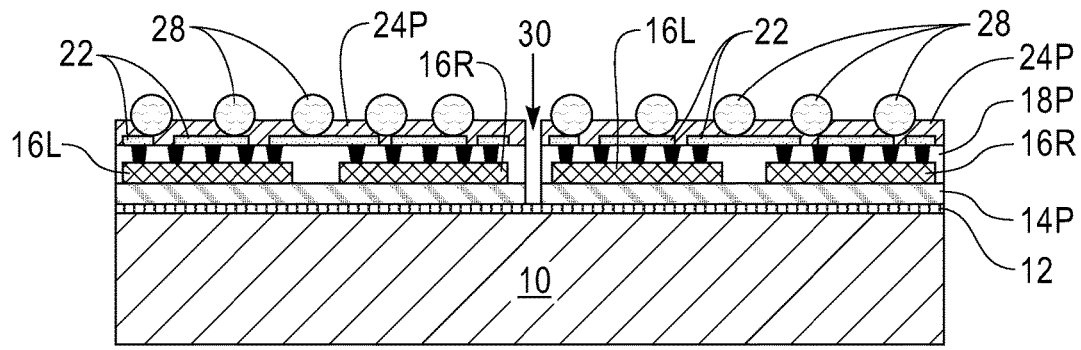
FIG. 14 is a cross sectional view of the exemplary support structure of FIG. 13 after forming a plurality of solder balls in each second opening.

Referring now to FIG. 14, there is illustrated the exemplary support structure of FIG. 13 after forming a plurality of solder balls 28 in each second opening 26, and formation of grooves 30. The solder balls 28 used in this embodiment of the present application are the same as those used in the previous embodiment of the present application. Thus, the materials and technique mentioned above in forming solder balls 28 in the previous embodiment of the present application can be used here to provide the solder balls 28 in this embodiment of the present application.

The grooves 30 of this embodiment can be formed utilizing one of the dicing techniques mentioned above. In this embodiment of the present application, each groove 30 is formed between neighboring semiconductor dies that are not electrically interconnected together.

Figure 15:
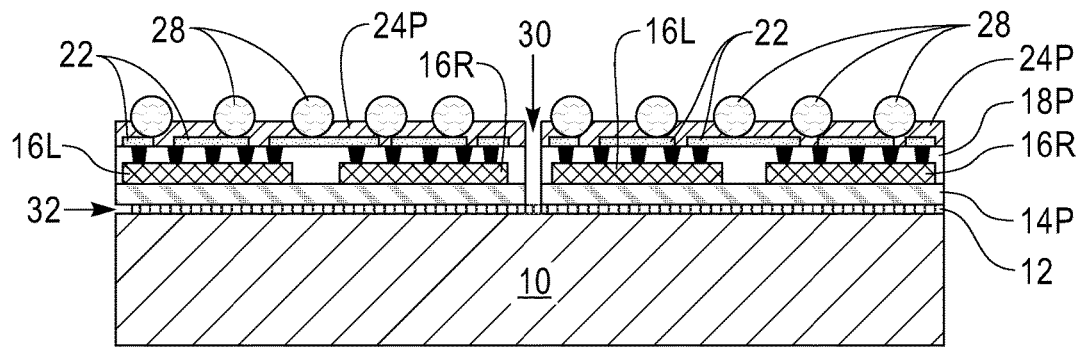
FIG. 15 is a cross sectional view of the exemplary support structure of FIG. 14 during an initial stage of infrared radiation (IR) exposure.

Referring now to FIG. 15, there is illustrated the exemplary support structure of FIG. 14 during an initial stage of infrared radiation (IR) exposure in which a portion of the release layer 12 is laser ablated to form voids 32. The IR exposure used in this embodiment of the present application is the same as that mentioned in the previous embodiment of the present application. Although not shown in any drawing, the IR exposure would continue such that the entirety of the release layer 12 is laser ablated from the structure.

Upon completion of the IR exposure, individual fan-out wafer level packages will be provided (not specifically shown) that include a plurality of electrically connected semiconductor die 16L-16R, solder balls 28, first and second redistribution layer portions (18P, 24P), metallization structures 22 embedded into the first and second redistribution layer portions (18P, 24P), and adhesive layer portion 14P completely debonded from the silicon handler wafer 10.

Referring now to FIGS. 16-22, there are illustrated yet another embodiment of the present application. Unlike the embodiments shown in FIGS. 1-15 in which the semiconductor dies are provided before the package, FIGS. 16-22 illustrates an embodiment in which the package is provided prior to the semiconductor dies.

Figure 16:
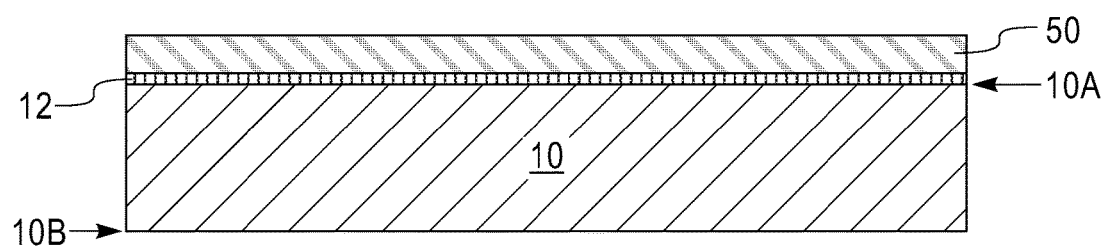
FIG. 16 is a cross sectional view of another exemplary support structure including, from bottom to top, a silicon handler wafer, a release layer and a redistribution layer that can be employed in accordance with another embodiment of the present application.

Referring first to FIG. 16, there is illustrated another exemplary support structure including, from bottom to top, a silicon handler wafer 10 having a first surface 10A and second surface 10B, a release layer 12 and a redistribution layer 50 that can be employed in accordance with another embodiment of the present application. The silicon handler wafer 10, release layer 14 and the redistribution layer 50 of this embodiment of the present application include materials and can be made utilizing the same techniques as mentioned above in forming the silicon handler wafer 10, release layer 12 and first redistribution layer 18 mentioned in the previous embodiments of the present application. In some embodiments (not shown), an antireflective coating as described above in FIG. 1B can be formed directly on the second surface 10B of the silicon handler wafer 10 and/or directly on the first surface 10A of the silicon handler wafer 10.

Figure 17:
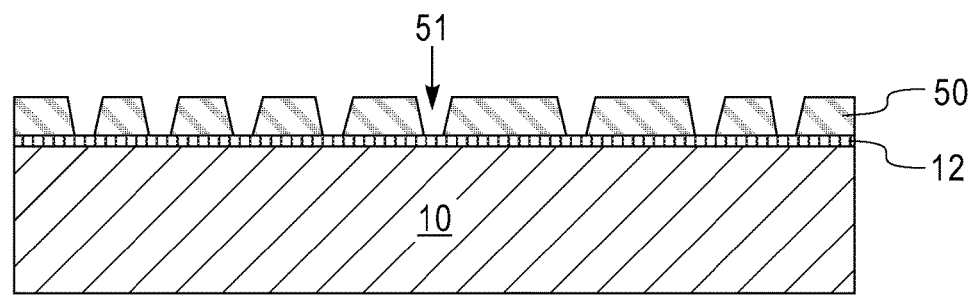
FIG. 17 is a cross sectional view of the exemplary support structure of FIG. 16 after forming a plurality of openings in the redistribution layer.

Referring now to FIG. 17, there is illustrated the exemplary support structure of FIG. 16 after forming a plurality of openings 51 in the redistribution layer 50. Opening 51 can be formed utilizing the same technique as mentioned above in forming first openings 20 within the first redistribution layer 18.

Figure 18:
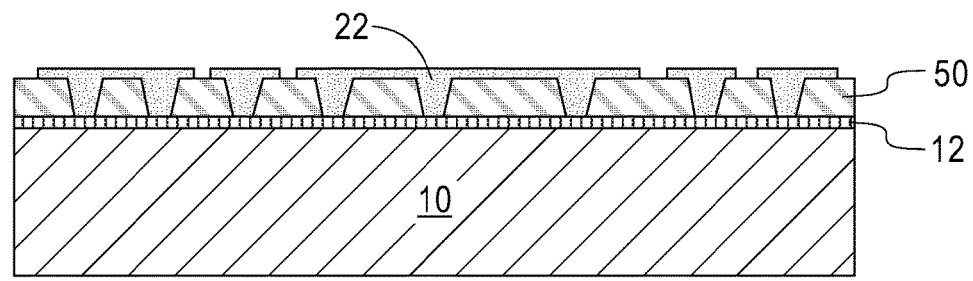
FIG. 18 is a cross sectional view of the exemplary support structure of FIG. 17 after performing a metallization process.

Referring now to FIG. 18, there is illustrated the exemplary support structure of FIG. 17 after performing a metallization process which provides metallization structures 22 within and upon the redistribution layer 50. The metallization process used in this embodiment of the present application is the same as those used in the previous embodiments of the present application. Also, the metallization structures 22 provided in this embodiment of the present application are the same as those mentioned above in the previous embodiments of the present application.

Figure 19:
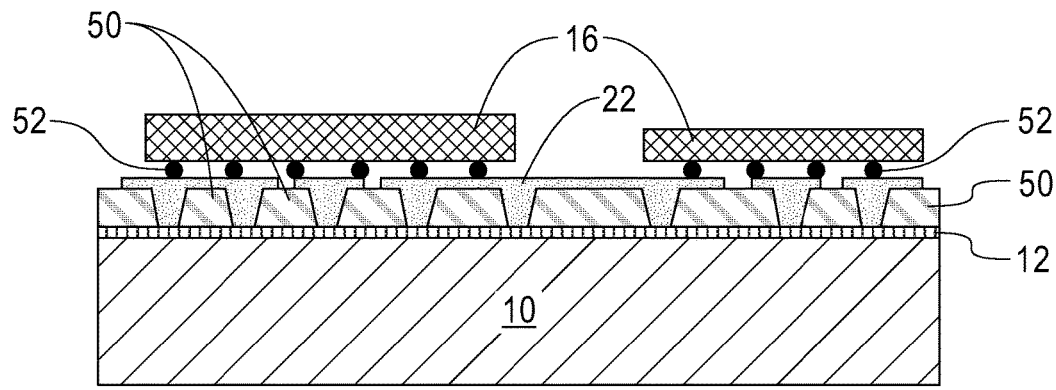
FIG. 19 is a cross sectional view of the exemplary support structure of FIG. 18 after forming a plurality of semiconductor dies atop the metallization structures provided by the metallization process.

Referring now to FIG. 19, there is illustrated the exemplary support structure of FIG. 18 after forming a plurality of semiconductor dies 16 atop the metallization structures 22 provided by the metallization process. As is shown, each semiconductor die 16 is attached to a topmost surface of an upper portion (i.e., metallic pad) of each metallization structure by an array of solder balls 52. The semiconductor die 16 used in this embodiment are the same as those mentioned in the previous embodiment of the present application. Also, the solder balls 52 used in this embodiment of the present application can be formed by techniques mentioned above in forming solder balls 28. Solder balls 52 may also include one of the materials mentioned above for solder balls 28.

Figure 20:
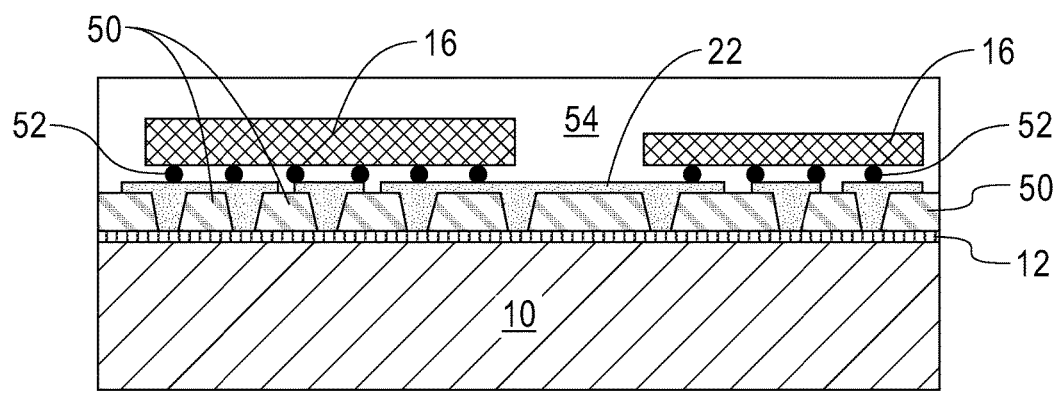
FIG. 20 is a cross sectional view of the exemplary support structure of FIG. 19 after forming a molding compound.

Referring now to FIG. 20, there is illustrated the exemplary support structure of FIG. 19 after forming a molding compound 54. The molding compound 54 that can be used in the present application includes any thermosetting polymer. The molding compound 54 can be formed by first providing a prepolymer resin utilizing a deposition process such as, for example, spin-on coating. A cure step follows the deposition of the prepolymer resin. The curing process which may be induced by the action of heat, suitable radiation or both, transforms the prepolymer resin into the thermosetting polymer by a crosslinking process. Examples of materials that can be used as the molding compound 54 include, but are not limited to an epoxy resin, a polyimide, or a polyester resin.

Figure 21:
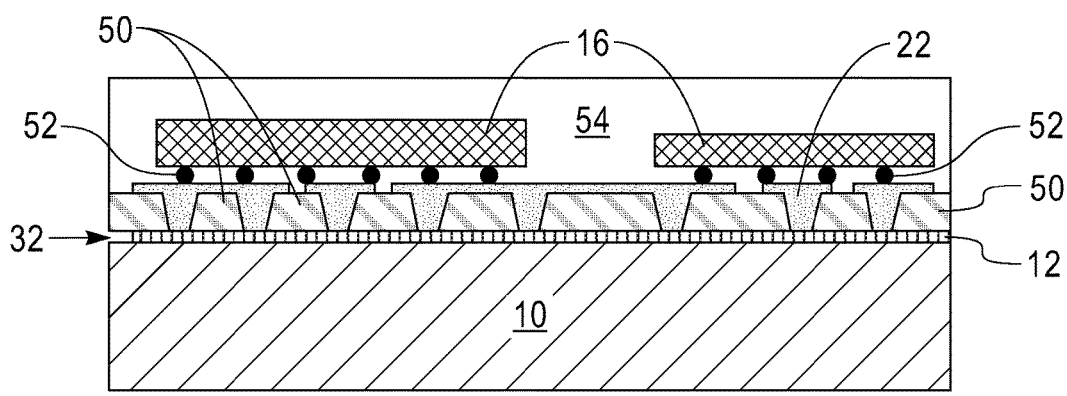
FIG. 21 is a cross sectional view of the exemplary support structure of FIG. 20 during an initial stage of infrared radiation (IR) exposure.
Figure 22:
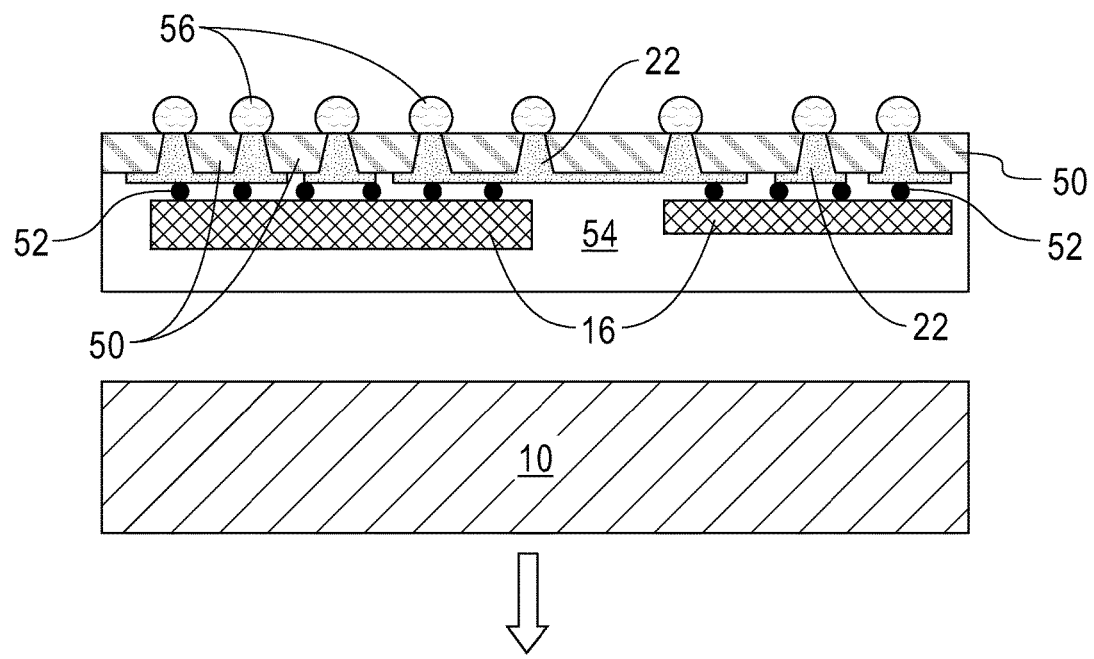
FIG. 22 is a cross sectional view of the exemplary support structure of FIG. 21 after completion of infrared radiation (IR) exposure, removal of the support structure of FIG. 20, and forming solder balls on exposed surfaces of the metallization structures.

Referring now to FIG. 21, there is illustrated the exemplary support structure of FIG. 20 during an initial stage of infrared radiation (IR) exposure in which void 32 is formed, and also, FIG. 22 which illustrates the exemplary support structure of FIG. 21 after completion of infrared radiation (IR) exposure, and forming solder balls 56 on exposed surfaces of the metallization structures 22. In this embodiment, solder balls 56 are formed on the exposed lower portions of each metallization structure 22 that is formed within the openings 51 of the redistribution layer 50. Solder balls 56 used in this embodiment of the present application can be formed by techniques mentioned above in forming solder balls 28. Solder balls 56 may also include one of the materials mentioned above for solder balls 28.

The IR exposure used in this embodiment of the present application is the same as that mentioned above in the previous embodiments of the present application. Upon complete IR exposure, the entirety of the release layer 12 is laser ablated such that the silicon handler substrate 10 is debonded from the remaining fan-out wafer level package.

In this embodiment, the fan-out wafer level package includes solder balls 56 formed on exposed surfaces of the lower portions of the metallization structures 22 that are embedded within the redistribution layer 50. The package further includes semiconductor dies 16 in electrical contact by solder balls 52 with exposed surfaces of the upper portion (i.e., metallic pads) of the metallization structure 22. A molding compound 54 surrounds the semiconductor dies 16, the solder balls 52 and the metallic pads of the metallization structures 22. In this embodiment, no dicing is needed.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A support structure for use in fan-out wafer level packaging, the support structure comprising:
a silicon handler wafer having a first surface and a second surface opposite the first surface, wherein a first anti-reflective coating is present on the first surface of the silicon handler wafer, and a second antireflective coating is present on the second surface of the silicon handler wafer;
a release layer located above the first surface of the silicon handler wafer; and
an adhesive layer located on a surface of the release layer.

2. The support structure of claim 1, further comprising a fan-out wafer level package present on a surface of the adhesive layer.

3. The support structure of claim 2, wherein the fan-out wafer level package comprises a plurality of single semiconductor die.

4. The support structure of claim 2, wherein the fan-out wafer level package comprises a plurality of semiconductor dies electrically connected to each other.

5. The support structure of claim 1, wherein the adhesive layer is composed of silicon dioxide, a dielectric metal oxide or a dielectric metal oxynitride.

6. The support structure of claim 1, wherein the release layer is composed of a metallic film or a layer of carbon.

7. The support structure of claim 1, wherein the release layer is composed of a graphene layer or a layer of carbon nanotubes.

8. A support structure for use in fan-out wafer level packaging, the support structure comprising:
a silicon handler wafer having a first surface and a second surface opposite the first surface, wherein a first anti-reflective coating is present on the first surface of the silicon handler wafer, and a second antireflective coating is present on the second surface of the silicon handler wafer;
a release layer located above the first surface of the silicon handler wafer; and
a redistribution layer located on a surface of the release layer.

9. The support structure of claim 8, where the redistribution layer is an element of a fan-out wafer level package.

10. The support structure of claim 9, wherein the fan-out wafer level package further comprises a plurality of single semiconductor die or a plurality of semiconductor dies electrically connected to each other.

11. The support structure of claim 8, wherein the release layer is composed of a metallic film or a layer of carbon.

12. The support structure of claim 8, wherein the release layer is composed of a graphene layer or a layer of carbon nanotubes.

* * * * *